(12) United States Patent
Park et al.

(10) Patent No.: US 9,054,210 B2
(45) Date of Patent: Jun. 9, 2015

(54) METHOD OF FABRICATING SEMICONDUCTOR DEVICE

(75) Inventors: Sang-Jine Park, Yongin-si (KR); Doo-Sung Yun, Suwon-si (KR); Bo-Un Yoon, Seoul (KR); Jeong-Nam Han, Seoul (KR); Kee-Sang Kwon, Seoul (KR); Won-Sang Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 84 days.

(21) Appl. No.: 13/479,679

(22) Filed: May 24, 2012

(65) Prior Publication Data
US 2013/0023100 A1 Jan. 24, 2013

(30) Foreign Application Priority Data
Jul. 18, 2011 (KR) ........................ 10-2011-0071117

(51) Int. Cl.
  *H01L 21/20* (2006.01)
  *H01L 21/36* (2006.01)
  *H01L 21/8234* (2006.01)
  *H01L 21/285* (2006.01)
  *H01L 21/02* (2006.01)
  *H01L 29/78* (2006.01)
  *H01L 21/768* (2006.01)
  *H01L 21/311* (2006.01)

(52) U.S. Cl.
  CPC ..... *H01L 21/823425* (2013.01); *H01L 21/823475* (2013.01); *H01L 29/78* (2013.01); *H01L 21/76897* (2013.01); *H01L 21/28518* (2013.01); *H01L 21/76814* (2013.01); *H01L 21/02063* (2013.01); *H01L 21/31116* (2013.01)

(58) Field of Classification Search
  CPC ................... H01L 21/02241; H01L 21/0226; H01L 21/02263; H01L 21/0228; H01L 21/02387; H01L 21/02389; H01L 21/02538; H01L 21/823425; H01L 21/823475; H01L 21/28518; H01L 21/76814; H01L 21/02063; H01L 21/31116; H01L 21/76897
  USPC ................... 438/689, 700, 704, 706, 718
  See application file for complete search history.

(56) References Cited

U.S. PATENT DOCUMENTS

| 6,143,377 | A  | * | 11/2000 | Miyamoto | ..... 427/576 |
| 6,239,015 | B1 | * | 5/2001  | Jung     | ..... 438/618 |
| 6,376,384 | B1 | * | 4/2002  | Yen et al. | ..... 438/706 |
| 6,417,055 | B2 | * | 7/2002  | Jang et al. | ..... 438/303 |

(Continued)

FOREIGN PATENT DOCUMENTS

| JP | 06-120188 A     | 4/1994 |
| KR | 10-2005-005183 A | 5/2005 |

*Primary Examiner* — Colleen A Matthews
*Assistant Examiner* — Quovaunda V Jefferson
(74) *Attorney, Agent, or Firm* — Lee & Morse, P.C.

(57) ABSTRACT

A method of fabricating a semiconductor device, the method including forming on a substrate a transistor that includes a gate electrode and a source and drain region, forming an interlayer insulating film on the transistor, forming a contact hole in the interlayer insulating film to expose a top surface of the source and drain region, and a thin film is formed at an interface between the contact hole and the exposed top surface of the source and drain region. The method further including selectively removing at least a portion of the thin film by performing an etching process in a non-plasma atmosphere, forming an ohmic contact film on the source and drain region where at least a portion of the thin film was selectively removed, and forming a contact plug by filling the contact hole with a conductive material.

19 Claims, 12 Drawing Sheets

(56) References Cited

U.S. PATENT DOCUMENTS

| | | |
|---|---|---|
| 7,581,549 B2 | 9/2009 | Johnson et al. |
| 2003/0085443 A1* | 5/2003 | Kamiya ........................ 257/508 |
| 2008/0044990 A1* | 2/2008 | Lee ............................... 438/586 |
| 2008/0142988 A1* | 6/2008 | Hyland et al. ................ 257/774 |

* cited by examiner

FIG. 20

|   | Time(Sec) | Chamber Pressure (mT) | N2(SSCM) | HF(SSCM) | Ar(SSCM) | HF P/P (mT) | TF etch (mT) | LDTEOS etch amount | Selectivity (TF/LD TEOS) |
|---|---|---|---|---|---|---|---|---|---|
| A | 180 | 1500 | 240 | 90 | 120 | 300 | 2.64 | 0.78 | 3.39 |
| B | 360 | 2000 | 240 | 90 | 120 | 400 | 14.80 | 0.54 | 27.38 |
| C | 180 | 2000 | 150 | 90 | 120 | 500 | 8.98 | 1.97 | 4.55 |
| D | 300 | 1200 | 0 | 400 | 200 | 800 | 1.13 | 0.10 | 10.83 |
| E | 300 | 2000 | 100 | 400 | 200 | 1143 | 3.14 | 0.54 | 5.82 |

METHOD OF FABRICATING SEMICONDUCTOR DEVICE

CROSS-REFERENCE TO RELATED APPLICATION

Korean Patent Application No. 10-2011-0071117 filed on Jul. 18, 2011 in the Korean Intellectual Property Office, is incorporated by reference herein in its entirety.

BACKGROUND

1. Field

Embodiments relate to a method of fabricating a semiconductor device.

2. Description of the Related Art

As semiconductor devices may be required to become more highly integrated, their design rule may be being rapidly reduced. Semiconductor devices which consume low power and operate at high speed may be desired. If silicide is formed in a region in which a gate and a contact are formed, surface resistance and contact resistance may be substantially reduced, and an increase in resistance caused by a smaller line width of a semiconductor device may be substantially avoided.

SUMMARY

Embodiments may be realized by a method that includes forming a transistor on a substrate, the transistor including a gate electrode and a source and drain region, forming an interlayer insulating film on the transistor, forming a contact hole in the interlayer insulating film to expose a top surface of the source and drain region, wherein a thin film is formed on the exposed top surface of the source and drain region, selectively removing at least a portion of the thin film by performing an etching process in a non-plasma atmosphere, forming an ohmic contact film on the source and drain region where at least a portion of the thin film was selectively removed, and forming a contact plug by filling the contact hole with a conductive material.

In an embodiment, the thin film may include Si, O, F, C, and N.

In an embodiment, the thin film may include: about 35 to about 45% Si, about 30 to about 35% O, about 5 to about 11% F, about 25 to about 30% C, and greater than 0 to about 1% N.

In an embodiment, the etching process may be performed with an etch selectivity of the thin film to the interlayer insulating film of about 20:1 to about 30:1.

In an embodiment, the etching process may be performed at a processing temperature of about 30 to about 65° C.

In an embodiment, the etching process may be performed at a processing pressure of about 1900 to about 2100 mTorr.

In an embodiment, the etching process may include providing an etching gas, the etching gas including a HF gas, a N2 gas, and an inert gas.

In an embodiment, the providing the etching gas may include providing: the HF gas at a flow rate of about 80 to about 100 sccm, the N2 gas at a flow rate of about 220 to about 250 sccm, and the inert gas at a flow rate of about 110 to about 130 sccm.

In an embodiment, the etching process may be performed at a processing temperature of about 30 to about 65° C. and a processing pressure of about 1900 to about 2100 mTorr, and the etching process may include providing an etching gas, wherein providing the etching gas includes providing: a HF gas at a flow rate of about 80 to about 100 sccm, a N2 gas at a flow rate of about 220 to about 250 sccm, and an inert gas at a flow rate of about 110 to about 130 sccm.

In an embodiment, the interlayer insulating film may include TEOS.

In an embodiment, forming the contact hole may include performing a dry etching process using an etching gas that includes $CF_4$ gas.

Embodiments may be realized by a method that includes forming a first transistor and a second transistor on a substrate, the first transistor including a first gate electrode and a first source and drain region, and the second transistor including a second gate electrode and a second source and drain region, forming an interlayer insulating film on the first and second transistors, forming a first contact hole in the interlayer insulating film to expose a top surface of the first source and drain region, forming a second contact hole in the interlayer insulating film to expose a top surface of the second source and drain region, wherein a thin film is formed on the exposed top surface of the first source and drain region, and on the exposed top surface of the second source and drain region, selectively removing at least a portion of the thin film by performing an etching process in a non-plasma atmosphere, forming a first ohmic contact film on the first source and drain region where at least a portion of the thin film was selectively removed, and forming a second ohmic contact film on the second source and drain region where at least a portion of the thin film was selectively removed, and forming a first contact plug and a second contact plug by respectively filling the first contact hole and the second contact hole with conductive materials, wherein, the second contract hole is a self-aligned contact hole, and the first contact hole is not a self-aligned contact hole.

In an embodiment, the thin film may include Si, O, F, C, and N.

In an embodiment, the etching process may be performed at a processing temperature of about 30 to about 65° C. and a processing pressure of about 1900 to about 2100 mTorr, and the etching process may include providing an etching gas, wherein providing the etching gas includes providing: a HF gas at a flow rate of about 80 to about 100 sccm, a N2 gas at a flow rate of about 220 to about 250 sccm, and an inert gas at a flow rate of about 110 to about 130 sccm.

In an embodiment, the interlayer insulating film may include TEOS.

In an embodiment, a sidewall of the first contact hole may only expose the interlayer insulating film; and a sidewall of the second contact hole may expose a spacer formed adjacent to the second gate electrode.

Embodiments may be realized by a method that includes forming interlayer insulating film on a semiconductor substrate, forming a contact hole in the interlayer insulating film to expose a top surface of the semiconductor substrate, wherein a thin film is formed on the exposed top surface of the silicon semiconductor substrate, selectively removing at least a portion of the thin film by performing an etching process in a non-plasma atmosphere, the etching process is performed with an etch selectivity of the thin film to the interlayer insulating film of about 20:1 to about 30:1, and forming an ohmic contact film on the semiconductor substrate where at least a portion of the thin film was selectively removed.

In an embodiment, the thin film may include Si, O, F, C, and N.

In an embodiment, the interlayer insulating film may include TEOS.

In an embodiment, the etching process may be performed at a processing temperature of about 30 to about 65° C. and a processing pressure of about 1900 to about 2100 mTorr, and the etching process may include providing an etching gas, wherein providing the etching gas includes providing: a HF gas at a flow rate of about 80 to about 100 sccm, a N2 gas at a flow rate of about 220 to about 250 sccm, and an inert gas at a flow rate of about 110 to about 130 sccm.

BRIEF DESCRIPTION OF THE DRAWINGS

Features will become apparent to those of ordinary skill in the art by describing in detail exemplary embodiments with reference to the attached drawings in which:

FIGS. 19 and 20 illustrate a graph of at least one effect that may be achieved by at least one embodiment.

DETAILED DESCRIPTION

Figure 1:
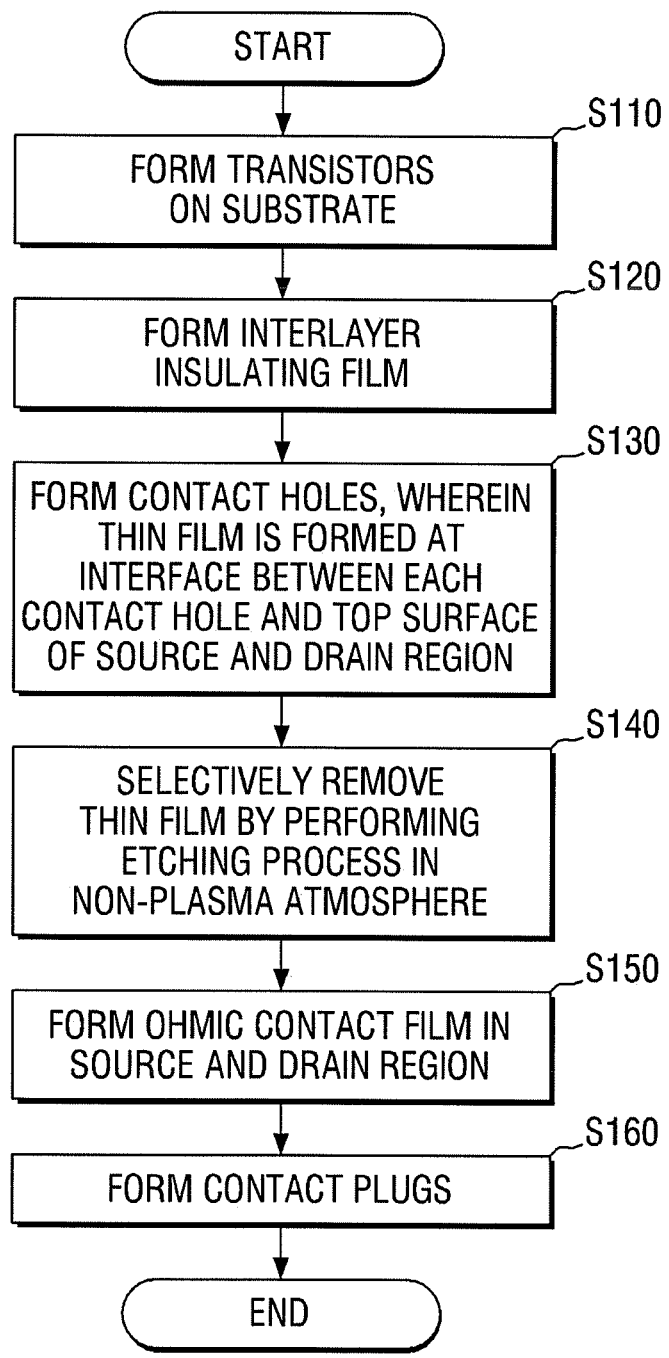
FIG. 1 illustrates a flowchart of a method of fabricating a semiconductor device according to at least one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is only for the purpose of describing certain embodiments, and is not intended to limit the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein may be described referring to plan views and/or cross-sectional views by way of ideal schematic views of at least one embodiment. Accordingly, the exemplary views may be modified depending on manufacturing technologies and/or tolerances. Therefore, the embodiments are not limited to those shown in the views, but may include modifications in configuration formed on the basis of manufacturing processes. Therefore, regions exemplified in figures have schematic properties, and shapes of regions shown in figures only exemplify specific shapes of regions of elements and do not limit aspects of the embodiments.

Unless otherwise defined, all terms (including technical and scientific terms) used herein have the same meaning as commonly understood by one of ordinary skill in the art to which this embodiments belongs. It will be further understood that terms, such as those defined in commonly used dictionaries, should be interpreted as having a meaning that is consistent with their meaning in the context of the relevant art and the embodiments, and will not be interpreted in an idealized or overly formal sense unless expressly so defined herein.

Hereinafter, a method of fabricating a semiconductor device according to at least one embodiment will be described with reference to FIGS. 1 through 10. FIG. 1 illustrates a flowchart illustrating a method of fabricating a semiconductor device according to an embodiment. FIGS. 2 through 9 illustrate cross-sectional views of intermediate structures illustrating the fabrication method of FIG. 1.

Figure 2:
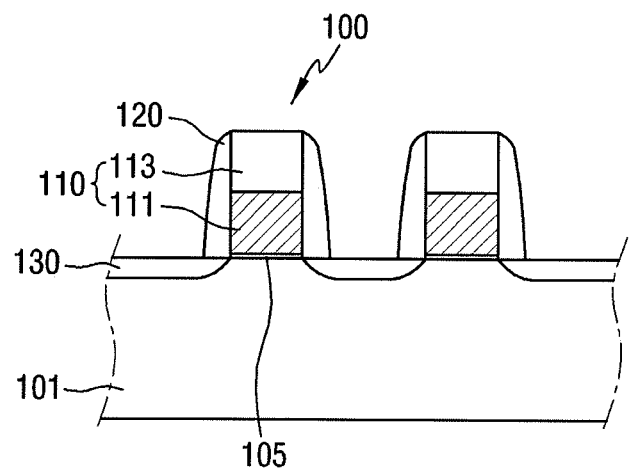
FIGS. 2 through 9 illustrate cross-sectional views of intermediate structures illustrating the method of FIG. 1.

Referring to FIGS. 1 and 2, transistors 100 may be formed on a substrate 101, and may each include a gate electrode 110 and a source and drain region 130 (operation S110).

The substrate 101 may be, e.g., a monocrystalline silicon substrate, a polycrystalline substrate, or a silicon substrate formed by selective epitaxial growth (SEG).

Each of the transistors 100 may include a gate electrode 110 and a source and drain region 130, and the gate electrode 110 may be formed on a gate insulating film 105. The gate electrode 110 may include a conductive film 111 and a hard mask film 113. The conductive film 111 may be, e.g., a single conductive film, such as a polysilicon film, a silicide film or a metal film, or a stack of one or more of these films. The hard mask film 113 may be provided at the top of the gate electrode 110. As shown in the drawings, spacers 120 may be formed on both sidewalls of the gate electrode 110. The source and drain region 130 may be formed within the substrate 101 between adjacent gate electrodes 110. The first source and drain region 130 may be formed by, e.g., an ion implantation process. Although not shown in the drawings, the source and drain region 130 may have a lightly doped drain (LDD) structure.

The gate insulating film 105 may be formed by thermal oxidation of the substrate 101. The gate insulating film 105 may be made of, e.g., silicon oxide, SiON, $Ge_xO_yN_z$, $Ge_xSi_yO_z$, a high-k material, a combination of these materials, or a sequential stack of one or more of these materials. Examples of the high-k material may include, e.g., $HfO_2$, $ZrO_2$, $Al_2O_3$, $Ta_2O_5$, hafnium silicate, zirconium silicate, or a combination of these materials.

The embodiments are not limited to the process of forming transistors 100, and transistors 100 may be formed on the substrate 101 by any process known in the art.

Figure 3:
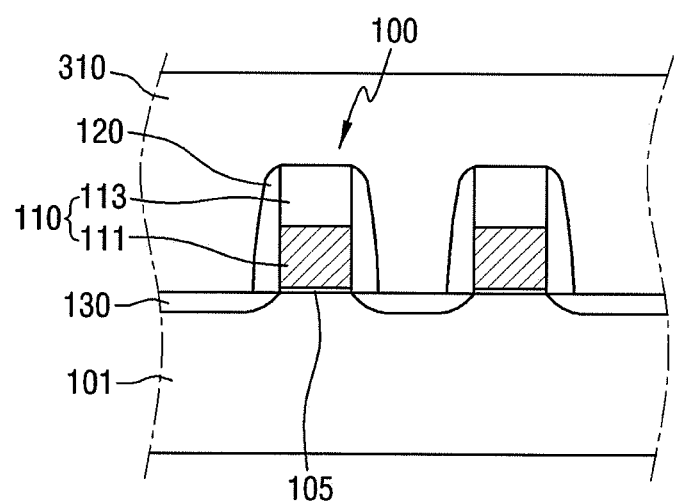

Referring to FIGS. 1 and 3, an interlayer insulating film 310 may be formed on the substrate 101 (operation S120).

The interlayer insulating film 310 may be formed by, e.g., a deposition process such as, e.g., chemical vapor deposition (CVD). the interlayer insulating film 310 may be formed as, e.g., a single or composite film which may include an oxide or a nitride. The interlayer insulating film 310 may include, e.g., tetraethyl orthosilicate (TEOS). The interlayer insulating film 310 may include only tetraethyl orthosilicate (TEOS).

Figure 4:
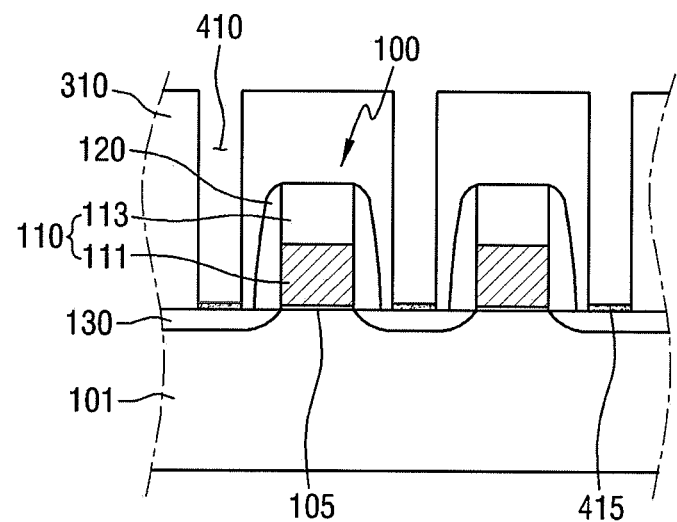

Referring to FIGS. 1 and 4, contact holes 410 may be formed in the interlayer insulating film 310, and a thin film 415 may be formed at an interface between each of the contact holes 410 and an exposed top surface of the source and drain region 130 (operation S130). The insulating film 310 may include portions that cover the transistors 100. The insulating film 310 may include sidewalls that cover the sides of the transistors 100. The insulating film 310 may include sidewalls that cover the sidewalls of the spacers 120 opposite the sidewalls of the gate electrode 110.

The contact holes 410 may be formed, e.g., by forming a photoresist pattern (not shown) on the interlayer insulating film 310 to mask all regions of the interlayer insulating film 310 except regions in which the contact holes 410 are to be formed. Then, the regions of the insulating film 310 that are exposed by the photoresist pattern (i.e. the regions in which the contact holes 410 are to be formed) may be etched to form the contact holes 410. The contact holes 410 may be formed such that each contact hole 410 exposes the top surface of the source and drain region 130. The contact holes 410 may be formed by etching the insulating film 310 down to the top surface of the source and drain region 130. In the etching process for forming the contact holes 410, an etching gas may be used, e.g., an etching gas that includes carbon tetrafluoride ($CF_4$) gas. The etching process may be, e.g., a dry etching process.

The thin film 415 may be formed on the top surface of the source and drain region 130. The thin film 415 may be formed on the top surface of the source and drain region 130 that is exposed during the etching of the insulating film 310.

The etching gas used in the etching process for forming the contact holes 410 may react with oxygen contained in the interlayer insulating film 310. Accordingly, the thin film 415 may be formed in the source and drain region 130 exposed by each of the contact holes 410. The thin film 415 may be formed in the source and drain region 130 as a result of the etching process for forming the contact holes 410. The thin film 415 may be formed naturally (i.e. without any additional processing) after the top surface of the source and drain region 130 is exposed. The thin film 415 may be, e.g., a native oxide or an etch induced oxide. The thin film 415 may be formed to a thickness of about 3 to about 5 nm. The thickness of the thin film 415 may vary according to the processing conditions of the etching process for forming the contact holes 410, e.g. the duration of the etching process.

As shown in the drawings, the thin film 415 may be formed at the interface between each of the contact holes 410 and the top surface of the source and drain region 130. The thin film 415 may be formed on the top surface of the source and drain region 130 exposed by each of the contact holes 410. When the substrate 101 is a silicon substrate, the thin film 415 may include Si, O, F, C and N elements. The thin film 415 may include about 35 to about 45% Si, about 30 to about 35% 0, about 5 to about 11% F, about 25 to about 30% C, and greater than 0 to about 1% N.

Figure 5:
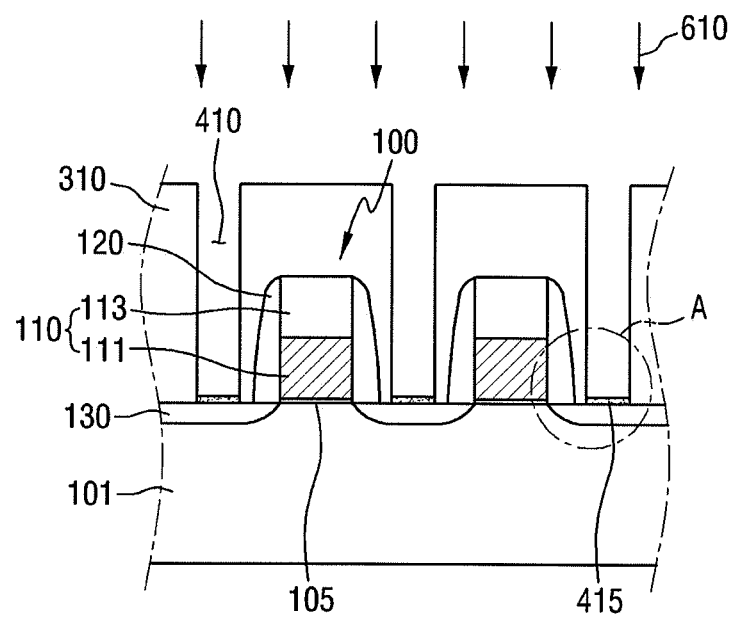
Figure 7:
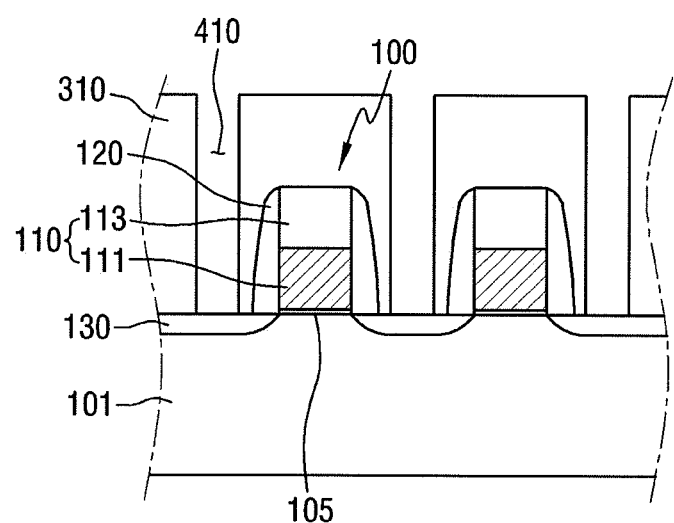

Referring to FIGS. 1, 5 and 7, the thin film 415 may be selectively removed by performing an etching process 610 in a non-plasma atmosphere (operation S140).

As shown in FIG. 5, the etching process 610 may be performed in a non-plasma atmosphere. The etching process 610 may not use plasma. The etching process 610 may be performed at a processing temperature of, e.g., about 25 to about 80° C.

Selectively removing the thin film 415 may include etching the thin film 415 with a high selectivity with respect to the interlayer insulating film 310. The etch selectivity of the thin film 415 to the interlayer insulating film 310 may be adjusted to, e.g., about 20:1 to about 30:1. The etching process 610 for selectively removing the thin film 415 may be performed at a processing pressure of about 1500 to about 2200 mTorr.

Selectively removing the thin film 415 may include providing an etching gas that includes, e.g., a HF gas, a $N_2$ gas, and an inert gas. The inert gas may include, e.g., an Ar gas. Providing the etching gases may include providing the HF gas at a flow rate of about 50 to about 120 sccm, the $N_2$ gas at a flow rate of about 200 to about 300 sccm, and the inert gas at a flow rate of about 100 to about 150 sccm.

The etching process 610 may include simultaneously adjusting the processing temperature, the processing pressure, and the flow rates of the components of the etching gase. For example, the etching process 610 may be performed at a temperature of about 25 to about 80° C., a pressure of about 1500 to about 2200 mTorr, and by providing a HF gas at a flow rate of about 50 to about 120 sccm, a $N_2$ gas at a flow rate of about 220 to about 250 sccm, and an inert gas at a flow rate of about 100 to about 150 sccm.

Figure 6:
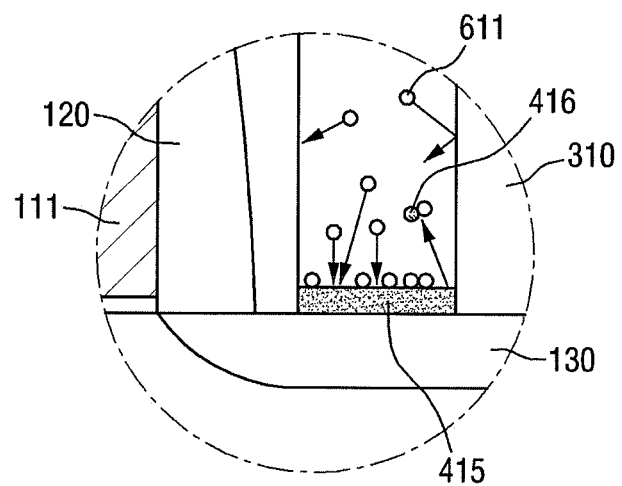

The etching process 610 may be adjusted so that the etch selectivity of the thin film 415 with respect to the interlayer insulating film 310 may be significantly increased as shown in FIG. 6. FIG. 6 illustrates a magnified view of the Circle A as illustrated in FIG. 5. As shown in FIG. 6, the etching gas 611 may selectively remove the thin film material 416 at a higher rate than the material of the interlayer insulating film 310.

The etching process 610 may be performed on the thin film 415 with a high selectivity, and the thin film 415 (see FIG. 5) may be removed as shown in FIG. 7. In FIG. 7, the thin film 415 (see FIG. 5) is illustrated as being completely removed. However, the thin film 415 may be completely removed or substantially completely removed. When the thin film 145 is substantially completely removed, it may all be removed, or part of the thin film 145 may be left unremoved such that the unremoved part does not cause a defect in a contact plug and a semiconductor device which may be formed in a subsequent processes.

Figure 8:
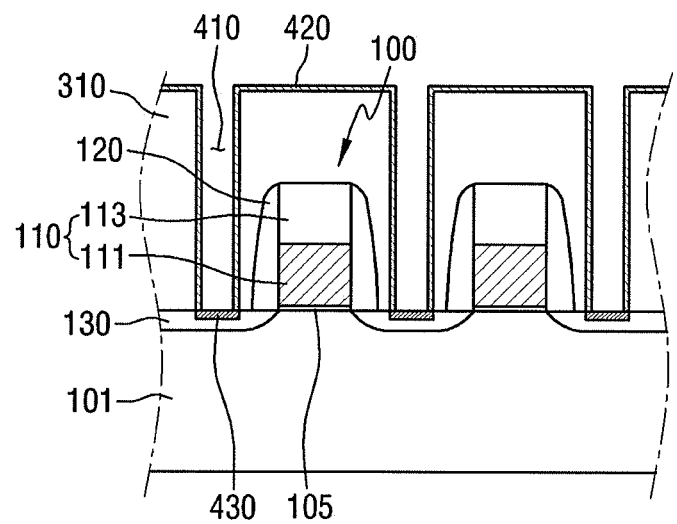

Referring to FIGS. 1 and 8, an ohmic contact film 430 may be formed in the source and drain region 130 (operation S150).

As shown in FIG. 8, the ohmic contact film 430 may formed on the top surface of the source and drain region 130 that is exposed by each of the contact holes 410. The ohmic contact film 430 may be a metal silicide film.

The ohmic contact film 430 may be formed, e.g., by depositing a metal layer 420 on a top surface of the interlayer insulating film 310, inner walls of the contact holes 410, and the top surface of the source and drain region 130 by, e.g., atomic layer deposition (ALD) or physical vapor deposition (PVD). The top surface of the source and drain region 130 and the metal layer 420 may be selectively silicided by a heat treatment process, thereby forming a metal silicide film.

When the depositing of the metal layer 420 and the siliciding process are performed separately as described above, the metal layer 420 may be deposited at a temperature at which the metal layer 420 and the top surface of the source and drain region 130 are not silicided.

In another embodiment, the metal layer 420 and the ohmic contact film 430 may be formed simultaneously. In this case, the metal layer 420 may be formed at a temperature of, e.g., about 400 to about 800° C. by, e.g., plasma enhanced chemical vapor deposition (PECVD). Accordingly, metal components may be deposited to form the metal layer 420, and, at the same time, metal components on the top surface of the source and drain region 130 may be selectively silicided, thereby forming as the ohmic contact film 430 a metal silicide film.

Figure 9:
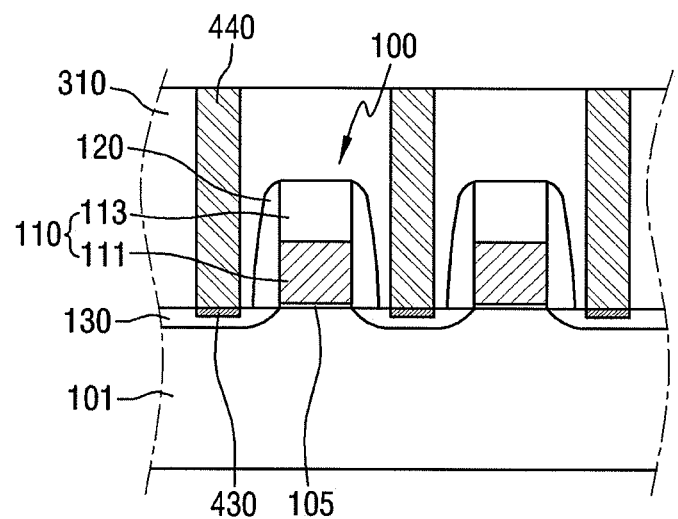

Referring to FIGS. 1 and 9, contact plugs 440 may be formed (operation S160).

Although not shown in the drawings, the unreacted metal layer 420 (see FIG. 8) may be removed. The ohmic contact film 430, which may be a metal silicide film, may be left unremoved, and the unsilicided metal layer 420 may be selectively removed. The metal layer 420 may be removed by, e.g., a dry or wet etching process with a high selectivity with respect to the ohmic contact film 420 (e.g. a high selectivity with respect to a metal silicide film). As shown in FIG. 9, each of the contact holes 410 may be filled with a conductive material (e.g., a metal material), and a process such as, e.g., chemical mechanical polishing (CMP) may be performed to expose a top surface of the interlayer insulating film 310.

Figure 11:
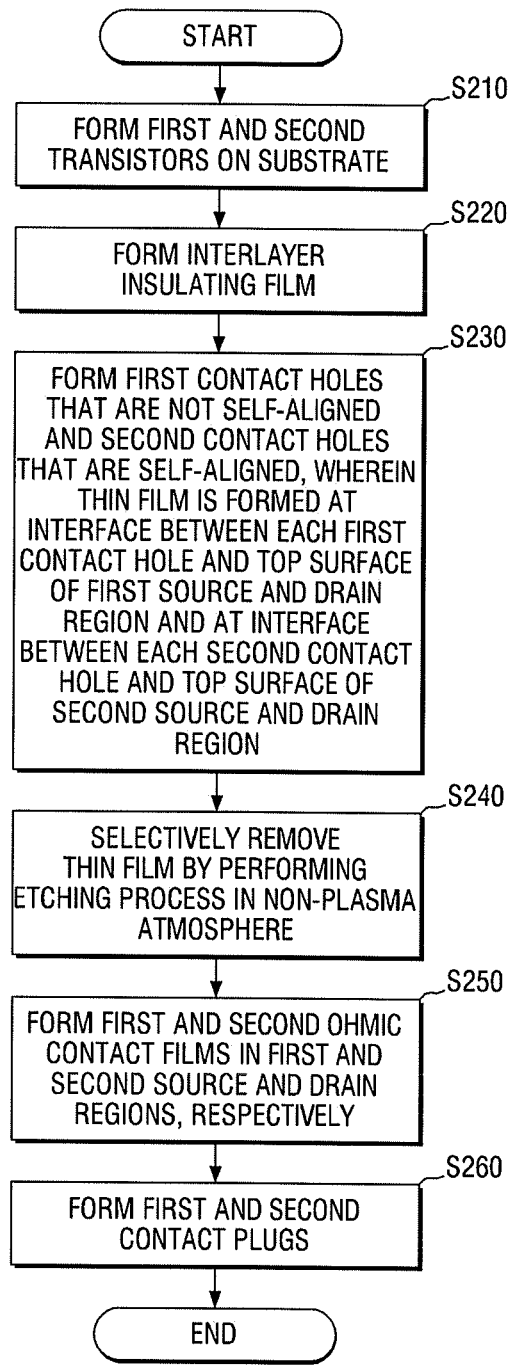
FIG. 11 illustrates a flowchart of a method of fabricating a semiconductor device according to at least one embodiment.

Hereinafter, a method of fabricating a semiconductor device according to at least one embodiment will be described with reference to FIGS. 11 through 18. FIG. 11 illustrates a flowchart of a method of fabricating a semiconductor device according to at least one embodiment. FIGS. 12 through 18 illustrate cross-sectional views of intermediate structures illustrating the fabrication method of FIG. 11.

The method of fabricating a semiconductor device according to the current embodiment may be different from the method of fabricating a semiconductor device according to the previously described embodiment in that a substrate may include a first region having first transistors and a second region having second transistors. First contact holes may be formed on the first region and second contact holes may be formed on the second region. The first contact holes may be not be self-aligned contact holes and the second contact holes may be self-aligned contact holes. For simplicity, a detailed description of elements substantially identical to those of the previously described embodiment may be omitted or simplified.

Figure 12:
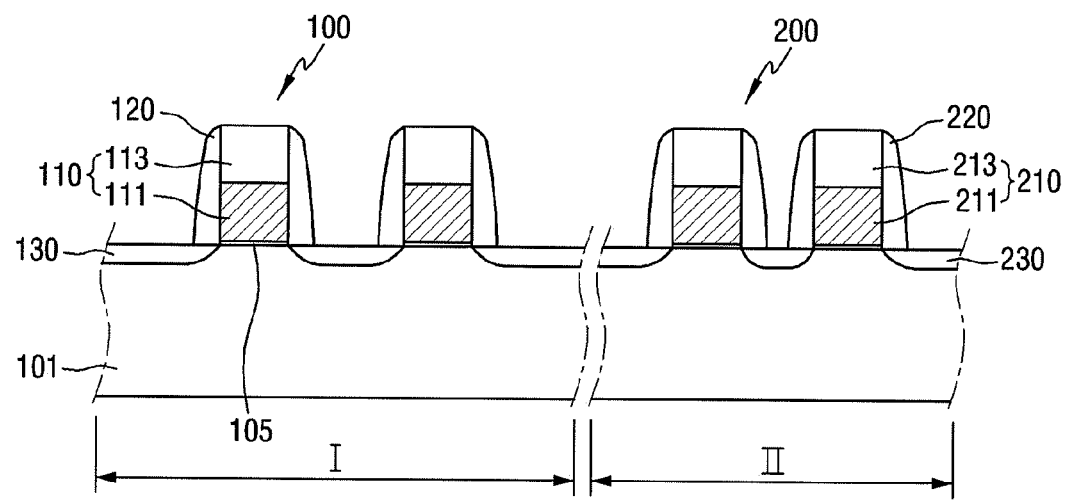
FIGS. 12 through 18 illustrate cross-sectional views of intermediate structures illustrating the method of FIG. 11.

Referring to FIGS. 11 and 12, first transistors 100 and second transistors 200 may be formed on a substrate 101 (operation S210).

As described above, the first transistors 100 may be formed on a first region I of the substrate 101, and the second transistors 200 may be formed on a second region II of the substrate 101. Each of the first transistors 100 may include a first gate electrode 110 and a first source and drain region 130, and each of the second transistors 200 may include a second gate electrode 210 and a second source and drain region 230.

The first transistors 100 may be formed on the first region I of the substrate 101, and the first gate electrode 110 may be formed on a gate insulating film 105 which may be formed by, e.g., thermal oxidation of the substrate 101. The first source and drain region 130 may be formed by, e.g., an ion implantation process. Further, first spacers 120 may be formed on both sidewalls of the first gate electrode 110.

The second transistors 200 may be formed on the second region II of the substrate 101, and the second gate electrode 210 may be formed on a gate insulating film 205 which may be formed by, e.g., thermal oxidation of the substrate 101. The second source and drain region 230 may be formed by, e.g., an ion implantation process. Further, second spacers 220 may be formed on both sidewalls of the second gate electrode 210.

Figure 13:
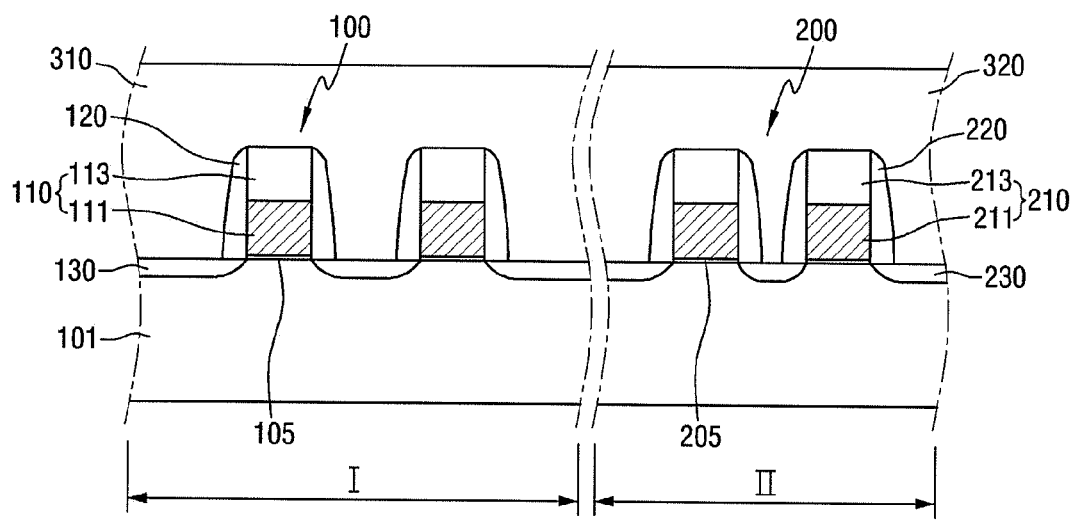

Referring to FIGS. 11 and 13, interlayer insulating films 310 and 320 may be formed (operation S220). The interlayer insulating films 310 and 320 may be formed on the substrate 101 having the first transistors 100 and the second transistors 200 by, e.g., a deposition process such as, e.g., CVD. The interlayer insulating films 310 and 320 may be formed on the substrate 101 as two separate films or as a single continuous layer. The interlayer insulating films 310 and 320 may include, e.g., tetraethyl orthosilicate (TEOS). Interlayer insulating films 310 and 320 may include only tetraethyl orthosilicate (TEOS).

Figure 14:
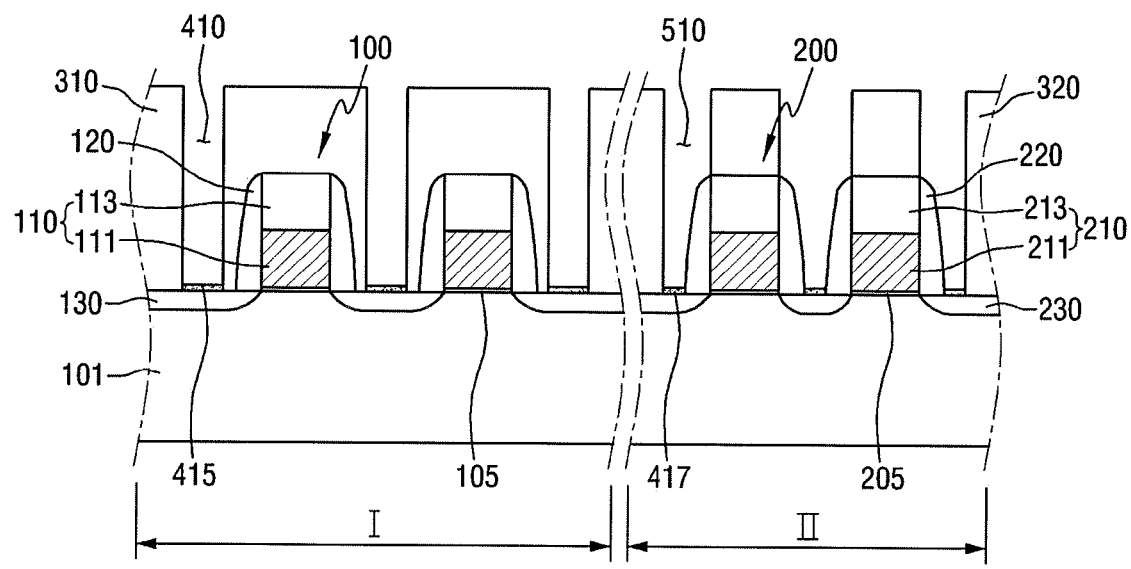

Referring to FIGS. 11 and 14, first contact holes 410 and second contact holes 510 may be formed in the interlayer insulating films 310 and 320, and thin films 415 and 417 may be formed on top surfaces of the first source and drain region 130 and the second source and drain region 230 (operation S230).

The first contact hole may not be a self-aligned contact hole and the second contact hole may be a self-aligned contact hole. A contact hole that is not self-aligned may be a contact hole formed using only a photoresist pattern as an etch mask, onto which an image of a contact hole is transferred. The shape and/or location of a contact hole that is not self-aligned may be only affected by the photoresist pattern. A contact hole that is not self-aligned may be used if a space between adjacent gates is larger than a margin of a photolithography process for forming the contact hole. When a space between adjacent gates is smaller than a margin of a photolithography process for forming a contact hole, a self-aligned contact hole may be used. A self-aligned contact hole may also be formed using a photoresist patterns an etch mask, onto which an image of a contact hole is transferred. However, spacers formed on sidewalls of a gate under the photoresist pattern may also affect the shape and/or location of the self-aligned contact hole. A self-aligned contact hole may be a contact hole formed and aligned using the spacers. A self-aligned contact hole may have sidewalls that expose sidewalls of a spacer. A contact hole that is not self-aligned may have sidewalls that do not expose sidewalls of a spacer. A contact hole that is not self-aligned may only expose sidewalls of an interlaying insulating film.

The first contact holes 410 and the second contact holes 510 may be formed by, e.g., forming a photoresist pattern (not shown) on the interlayer insulating films 310 and 320 to mask all regions of the interlayer insulating films 310 and 320, except the regions in which the first contact holes 410 and the second contact holes 510 are to be formed. Then, the regions of the interlayer insulating films 310 and 320 that are exposed by the photoresist pattern (i.e. the regions in which the contact holes 410 are to be formed) may be etched to form the first contact holes 410, which each may expose the top surface of the first source and drain region 130, and the second contact holes 510, which each may expose the top surface of the second source and drain region 230. The first and second contact holes 410 and 510 may be formed by etching the interlayer insulating films 310 and 320 down to the top surface of the first and second source and drain regions 130 and 230. In the etching process for forming the first and second contact holes 410 and 510, an etching gas may be used, e.g., an etching gas that includes carbon tetrafluoride ($CF_4$) gas. The etching process may be, e.g., a dry etching process.

As shown in the drawings, the thin films 415 and 417 may be formed on the top surfaces of the first source and drain region 130 and the second source and drain region 230, respectively. The etching gas used in the etching process for forming the first contact holes 410 and the second contact holes 510 may react with oxygen contained in the interlayer insulating films 310 and 320. Accordingly, the thin film 415 may be formed on the top surface of the first source and drain region 130 exposed by each of the first contact holes 410, and the thin film 417 may be formed on the top surface of the second source and drain region 230 exposed by each of the second contact holes 510. The thin films 415 and 417 may be formed naturally (i.e. without any additional processing) after the top surface of the first and second source and drain regions 130 and 230 are exposed. The thickness and composition of the thin films 415 and 417 may be substantially the same as those of the thin film 415 according to the previous discussed embodiment, and thus a repetitive description thereof will be omitted.

Figure 15:
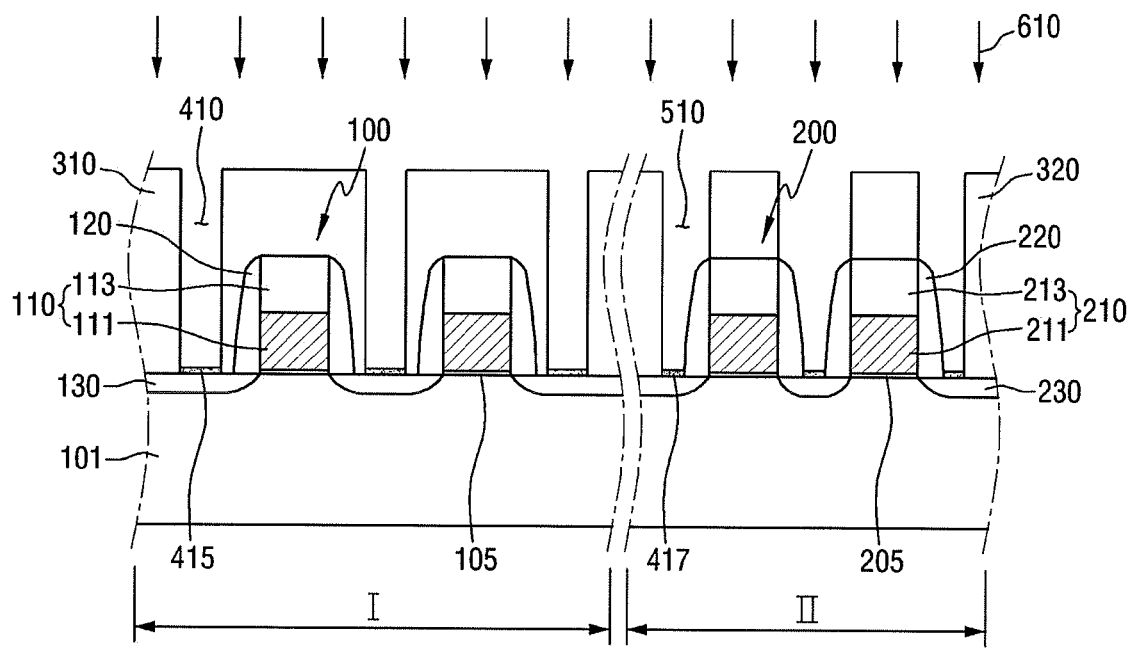
Figure 16:
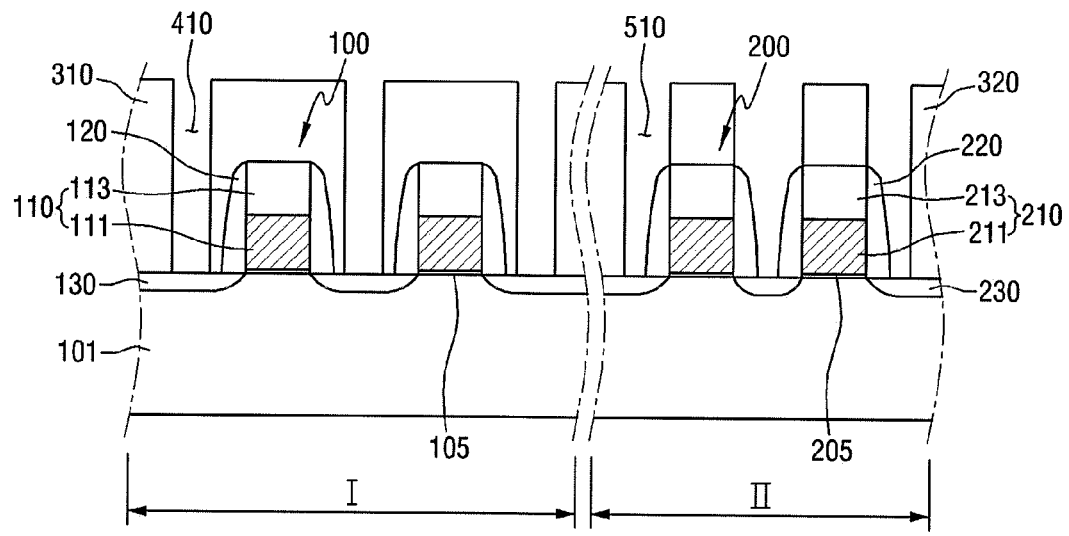

Referring to FIGS. 11, 15 and 16, the thin films 415 and 417 may be selectively removed by performing an etching process 610 in a non-plasma atmosphere (operation S240).

As shown in FIG. 15, the etching process 610 may be performed in a non-plasma atmosphere. The etching process 610 may not use plasma. The etching process 610 may be performed at a processing temperature of, e.g., about 25 to about 80° C.

Selectively removing the thin films 415 and 417 may include etching the thin films 415 and 417 with a high selectivity with respect to the interlayer insulating films 310 and 320. The etch selectivity of the thin films 415 and 417 to the interlayer insulating films 310 and 320 may be adjusted to, e.g., about 20:1 to about 30:1. The etching process 610 for selectively removing of the thin films 415 and 417 to form the second contact holes 510 may include removing the thin films 415 and 417 with a high selectivity with respect to the interlayer insulating films 310 and 320 and second spacers 220.

The etching process 610 for selectively removing the thin films 415 and 417 may be performed at a processing pressure of about 1900 to about 2100 mTorr. In the etching process 610, an etching gas may be used, the etching gas may include, e.g., a HF gas, a $N_2$ gas, and an inert gas. The inert gas may include, e.g., an Ar gas. Providing the etching gas may include providing the HF gas at a flow rate of about 80 to about 100 sccm, providing the $N_2$ gas at a flow rate of about 220 to about 250 sccm, and providing the inert gas at a flow rate of about 110 to about 130 sccm.

The thin films 415 and 417 may be removed with a high selectivity, by simultaneously adjusting the processing conditions of the etching process 610, e.g., the processing temperature, the processing pressure, and the flow rates of the components of the etching gase. For example, the etching process 610 may be performed at a temperature of about 30 to about 65° C., a pressure of about 1900 to about 2100 mTorr, and by providing the HF gas at a flow rate of about 80 to about 100 sccm, the $N_2$ gas at a flow rate of about 220 to about 250 sccm, and the inert gas at a flow rate of about 110 to about 130 sccm.

The thin films 415 and 417 may be completely removed or substantially completely removed as shown in FIG. 16, and as discussed in the previously discussed embodiment.

Figure 17:
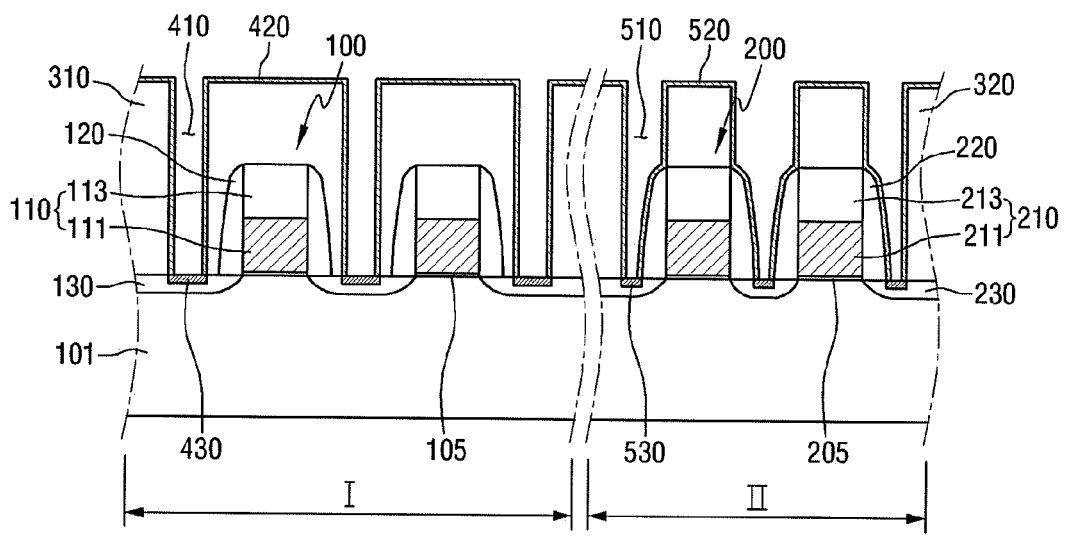

Referring to FIGS. 11 and 17, a first ohmic contact film 430 and a second ohmic contact film 530 may be formed in the first source and drain region 130 and the second source and drain region 230, respectively (operation S250).

Referring to FIG. 17, the first ohmic contact film 430 may be formed on the top surface of the first source and drain region 130 that is exposed by each of the first contact holes 410, and the second ohmic contact film 530 may formed on the top surface of the second source and drain region 230 that is exposed by each of the second contact holes 510. The first and second ohmic contact films 430 and 530 may be metal silicide films. Since the first and second ohmic contact films 430 and 530 may be substantially the same as those of the previously described embodiment, a repetitive description thereof will be omitted.

Figure 18:
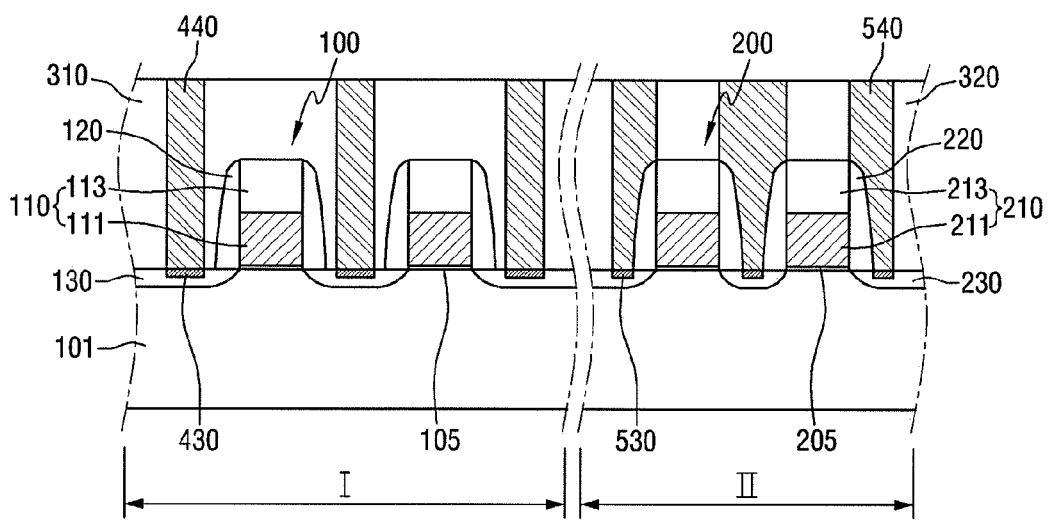

Referring to FIGS. 11 and 18, first contact plugs 440 and second contact plugs 540 may be formed (operation S260).

Although not shown in the drawings, unreacted first and second metal layers 420 and 520 (see FIG. 17) may be removed. The first and second ohmic contact film 430 and 530, which may be metal silicide films, may be left unremoved, while the unsilicided first and second metal layers 420 and 520 may be selectively removed. The first and second metal layers 420 and 520 may be removed by, e.g., a dry or wet etching process with a high selectivity with respect to the first and second ohmic contact films 430 and 530 (e.g., a high selectivity with respect to a metal silicide film). As shown in FIG. 18, each of the first contact holes 410 and each of the second contact holes 510 may be filled with a conductive material (e.g., a metal material), and a process such as, e.g., CMP may be performed to expose top surfaces of the interlayer insulating film 310 and 320.

Figure 10:
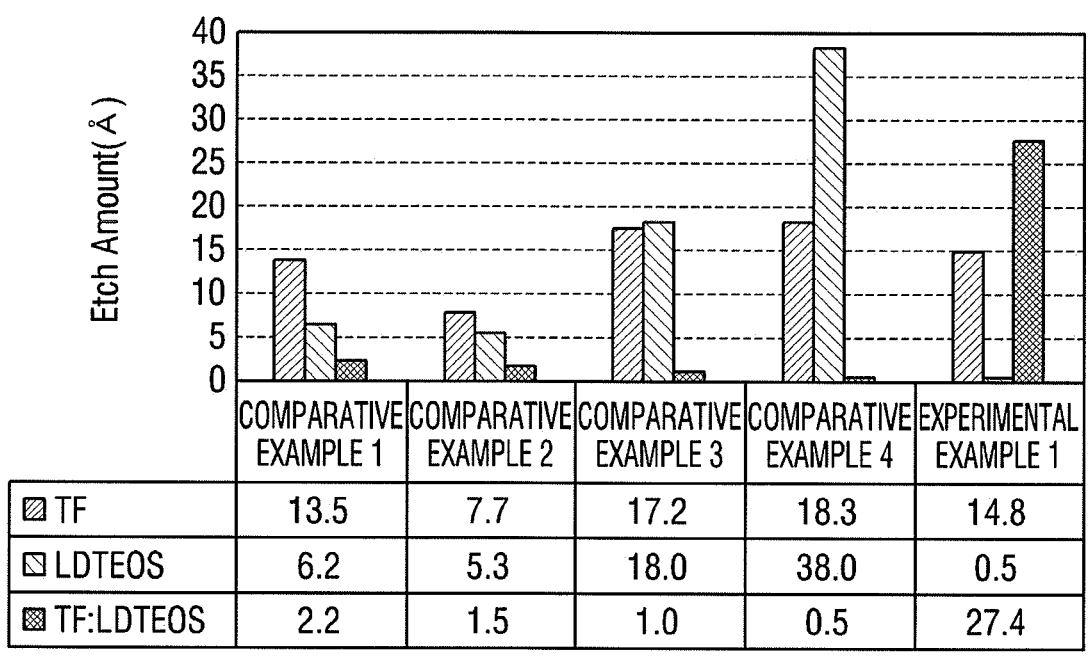
FIG. 10 illustrates a bar graph of at least one effect that may be achieved by the at least one embodiment.

At least one embodiment will now be described in further detail with reference to FIG. 10 and the following experimental example. FIG. 10 illustrates a bar graph of at least one effect that may be achieved by at least one embodiment. Information that may not provided below can be readily inferred by those of ordinary skill in the art, and thus a description thereof may be omitted.

Experimental Example

Experiments were conducted to identify a high selectivity for a thin film in an etching process applied to at least one embodiment. An etch amount of an interlayer insulating film, an etch amount of a thin film, and a ratio of the etch amount of the thin film to that of the interlayer insulating film were measured under processing conditions of Comparative Examples 1 through 4 and Experimental Example 1. The results are shown in the graph of FIG. 10.

A volume ratio of distilled water to HF was 200:1 in Comparative Example 1 and 1000:1 in Comparative Example 2. In Comparative Example 3, $NH_3$ and HF gases were used as etching gases, and a target etch amount of an oxide film was set to 20 Å using Chemical Oxide Removal (COR) equipment. In Comparative Example 4, $NH_3$ and HF gases were used as etching gases, and a target etch amount of an oxide film was set to 40 Å using the COR equipment.

In Experimental Example 1, HF, $N_2$ and Ar gases were provided as etching gases at flow rates of 80 sccm, 120 sccm and 220 sccm, respectively, at a processing temperature of 35° C. and a processing pressure of 1200 mTorr.

Referring to FIG. 10, in Comparative 1, the thin film (designated as TF), which includes Si, O, F, C, and N, was etched by 13.5 Å, and the interlayer insulating film, which was a low deposition rate TEOS, (LDTEOS)) was etched by 6.2 Å. In addition, a ratio of the etch amount of the thin film to that of the interlayer insulating film was 2.2:1. In Comparative 2, the thin film was etched by 7.7 Å, and the interlayer insulating film was etched by 5.3 Å. In addition, a ratio of the etch amount of the thin film to that of the interlayer insulating film was 1.5:1. In Comparative 3, the thin film was etched by 17.2 Å, and the interlayer insulating film was etched by 18.0 Å. In addition, a ratio of the etch amount of the thin film to that of the interlayer insulating film was 1.0:1. In Comparative 4, the thin film was etched by 18.3 Å, and the interlayer insulating film was etched by 38.0 Å. In addition, a ratio of the etch amount of the thin film to that of the interlayer insulating film was 0.5:1.

On the other hand, in Experimental Example 1, the thin film was etched by 14.8 Å, and the interlayer insulating film was etched by 0.5 Å. In addition, a ratio of the etch amount of the thin film to that of the interlayer insulating film was 27.4:1. According to the above results, the etch selectivity of the thin film with respect to the interlayer insulating film is far higher under the processing conditions of Experimental Example 1 than under the other processing conditions. Accordingly, the amount of the interlayer insulating film which is etched during the etching process for removing the thin film is relatively small. That is, the thin film may be removed with relatively high selectivity during the etching of the thin film, thereby substantially preventing or minimizing the expansion of contact holes due to a loss of the interlayer insulating film.

Figure 19:
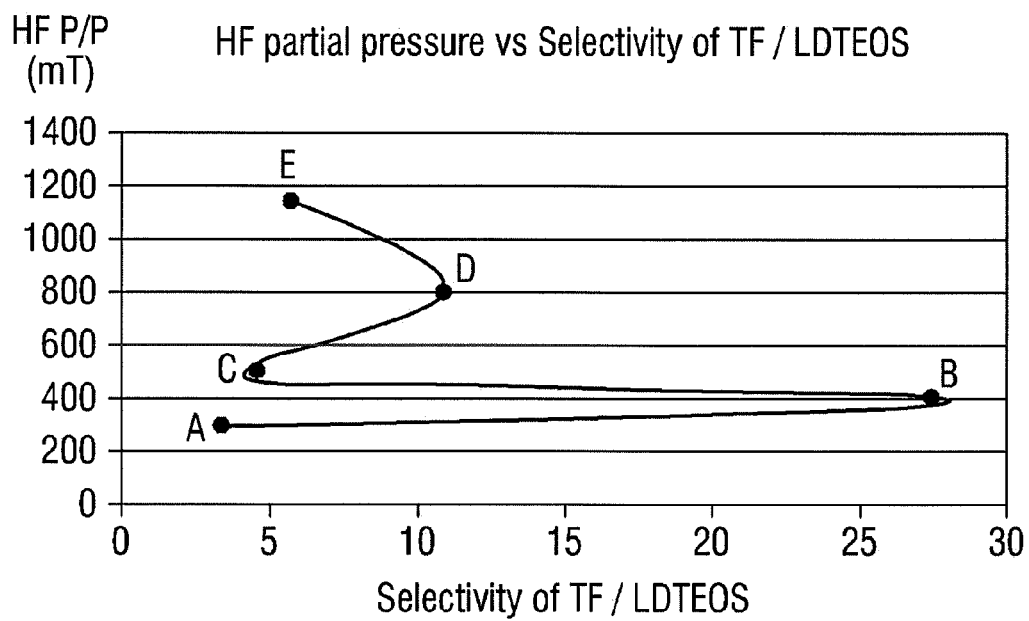

FIG. 19 illustrates how HF partial pressure may relate to the selectivity of the thin film (TF) and a low deposition rate TEOS film (LDTEOS). FIG. 20 illustrates the conditions of the data points in FIG. 19. In detail, the time is provided in seconds, the chamber pressure is provided in milliTorr, the amount of $N_2$, HF, and Ar is provided in standard cubic centimeters, the partial pressure (P/P) of HF is provided in milliTorr, and the amount that the TF and LDTEOS were etched is provided, along with the corresponding selectivity value.

By way of summary and review, in an etching process for forming a contact hole in which silicide may be formed, a thin film may be formed on the surface of a source or drain region exposed by the contact hole. The thin film may make it difficult to form silicide in a stable manner.

At least one aspect of at least one embodiment may be that the etch selectivity of the thin film with respect to the interlayer insulating film may be significantly increased. As a result, etching of the interlayer insulating film may be substantially prevented or minimized when the etching process for removing the thin film is performed. In turn, expansion of the contact holes towards the gate electrode may be substantially prevented or minimized. Expansion of the contact holes towards the gate electrode may cause a short circuit between the gate electrode and each of the contact holes if the contact holes are filled with a conductive material. That is, according to at least one embodiment, a semiconductor device with optimized or improved reliability may be fabricated. Also, if the expansion of the contact holes towards the gate electrode is substantially prevented or minimized, a margin between the gate electrode and each of the contact holes may be reduced, and the integration density of the semiconductor device may be substantially increased or optimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   forming a transistor on a substrate, the transistor including a gate electrode and a source and drain region;
   forming an interlayer insulating film on the transistor;
   forming a contact hole in the interlayer insulating film to expose a top surface of the source and drain region, wherein a thin film is formed on the exposed top surface of the source and drain region;
   selectively removing at least a portion of the thin film by performing an etching process with an adjusted etch selectivity of the thin film to the interlayer insulating film in a non-plasma atmosphere;
   forming an ohmic contact film on the source and drain region where at least a portion of the thin film was selectively removed; and
   forming a contact plug by filling the contact hole with a conductive material, wherein the etching process includes providing an etching gas, the etching gas including a HF gas, a $N_2$ gas, and an inert gas.

2. The method as claimed in claim 1, wherein the thin film includes Si, O, F, C, and N.

3. The method as claimed in claim 2, wherein the thin film includes:
   about 35 to about 45% Si,
   about 30 to about 35% O,
   about 5 to about 11% F,
   about 25 to about 30% C, and
   greater than 0 to about 1% N.

4. The method as claimed in claim 1, wherein the etch selectivity of the thin film to the interlayer insulating film is about 20:1 to about 30:1.

5. The method as claimed in claim 1, wherein the etching process is performed at a processing temperature of about 30 to about 65° C.

6. The method as claimed in claim 1, wherein the etching process is performed at a processing pressure of about 1900 to about 2100 mTorr.

7. The method as claimed in claim 1, wherein providing the etching gas includes providing:
   the HF gas at a flow rate of about 80 to about 100 sccm,
   the $N_2$ gas at a flow rate of about 220 to about 250 sccm, and
   the inert gas at a flow rate of about 110 to about 130 sccm.

8. The method as claimed in claim 1, wherein:
   the etching process is performed at a processing temperature of about 30 to about 65° C. and a processing pressure of about 1900 to about 2100 mTorr, and
   the etching process includes providing an etching gas, wherein providing the etching gas includes providing:
   the HF gas at a flow rate of about 80 to about 100 sccm,
   the $N_2$ gas at a flow rate of about 220 to about 250 sccm, and
   the inert gas at a flow rate of about 110 to about 130 sccm.

9. The method as claimed in claim 1, wherein the interlayer insulating film includes TEOS.

10. The method as claimed in claim 1, wherein forming the contact hole includes performing a dry etching process using an etching gas that includes $CF_4$ gas.

11. A method of fabricating a semiconductor device, the method comprising:
   forming a first transistor and a second transistor on a substrate, the first transistor including a first gate electrode and a first source and drain region, and the second transistor including a second gate electrode and a second source and drain region;
   forming an interlayer insulating film on the first and second transistors;
   forming a first contact hole in the interlayer insulating film to expose a top surface of the first source and drain region;
   forming a second contact hole in the interlayer insulating film to expose a top surface of the second source and drain region, wherein a thin film is formed on the exposed top surface of the first source and drain region, and on the exposed top surface of the second source and drain region;
   selectively removing at least a portion of the thin film by performing an etching process with an adjusted etch selectivity of the thin film to the interlayer insulating film in a non-plasma atmosphere;

forming a first ohmic contact film on the first source and drain region where at least a portion of the thin film was selectively removed, and forming a second ohmic contact film on the second source and drain region where at least a portion of the thin film was selectively removed; and forming a first contact plug and a second contact plug by respectively filling the first contact hole and the second contact hole with conductive materials;

wherein, the second contract hole is a self-aligned contact hole, and the first contact hole is not a self-aligned contact hole, and wherein the etching process includes providing an etching gas, the etching gas including a HF gas, a $N_2$ gas, and an inert gas.

12. The method as claimed in claim 11, wherein the thin film includes Si, O, F, C, and N.

13. The method as claimed in claim 11, wherein:
the etching process is performed at a processing temperature of about 30 to about 65° C. and a processing pressure of about 1900 to about 2100 mTorr, and
the etching process includes providing an etching gas, wherein providing the etching gas includes providing:
the HF gas at a flow rate of about 80 to about 100 sccm,
the $N_2$ gas at a flow rate of about 220 to about 250 sccm, and
the inert gas at a flow rate of about 110 to about 130 sccm.

14. The method as claimed in claim 11, wherein the interlayer insulating film includes TEOS.

15. The method as claimed in claim 11, wherein:
a sidewall of the first contact hole only exposes the interlayer insulating film; and
a sidewall of the second contact hole exposes a spacer formed adjacent to the second gate electrode.

16. A method of fabricating a semiconductor device, the method comprising:
forming interlayer insulating film on a semiconductor substrate;
forming a contact hole in the interlayer insulating film to expose a top surface of the semiconductor substrate, wherein a thin film is formed on the exposed top surface of the semiconductor substrate;
selectively removing at least a portion of the thin film by performing an etching process in a non-plasma atmosphere, wherein the etching process is performed with an adjusted etch selectivity of the thin film to the interlayer insulating film by providing an etching gas, the etching gas including a HF gas, a $N_2$ gas, and an inert gas; and
forming an ohmic contact film on the semiconductor substrate where at least a portion of the thin film was selectively removed.

17. The method as claimed in claim 16, wherein the thin film includes Si, O, F, C, and N.

18. The method as claimed in claim 17, wherein the interlayer insulation film includes TEOS.

19. The method as claimed in claim 18, wherein:
the etching process is performed at a processing temperature of about 30 to about 65° C. and a processing pressure of about 1900 to about 2100 mTorr, and
the etching process includes providing an etching gas, wherein providing the etching gas includes providing:
a HF gas at a flow rate of about 80 to about 100 sccm,
a $N_2$ gas at a flow rate of about 220 to about 250 sccm, and
an inert gas at a flow rate of about 110 to about 130 sccm.

* * * * *